United States Patent
Ko

(10) Patent No.: US 9,305,909 B2
(45) Date of Patent: Apr. 5, 2016

(54) 3D SEMICONDUCTOR APPARATUS FOR INITIALIZING CHANNELS

(71) Applicant: SK hynix Inc., Icheon-si Gyeonggi-do (KR)

(72) Inventor: Jae Bum Ko, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/244,459

(22) Filed: Apr. 3, 2014

(65) Prior Publication Data
US 2015/0187744 A1    Jul. 2, 2015

(30) Foreign Application Priority Data
Dec. 30, 2013  (KR) .................. 10-2013-0166562

(51) Int. Cl.
| | |
|---|---|
| *H01L 25/04* | (2014.01) |
| *H01L 25/065* | (2006.01) |
| *H01L 25/075* | (2006.01) |
| *H01L 25/18* | (2006.01) |
| *G11C 7/14* | (2006.01) |
| *H01L 23/00* | (2006.01) |

(52) U.S. Cl.
CPC *H01L 25/18* (2013.01); *G11C 7/14* (2013.01); *H01L 25/043* (2013.01); *H01L 25/0652* (2013.01); *H01L 25/0657* (2013.01); *H01L 25/0756* (2013.01); *H01L 24/16* (2013.01); *H01L 2224/16145* (2013.01); *H01L 2225/06513* (2013.01); *H01L 2225/06541* (2013.01); *H01L 2924/14* (2013.01); *H01L 2924/1431* (2013.01); *H01L 2924/1432* (2013.01); *H01L 2924/1433* (2013.01); *H01L 2924/1434* (2013.01); *H01L 2924/1436* (2013.01); *H01L 2924/1438* (2013.01); *H01L 2924/1441* (2013.01); *H01L 2924/1443* (2013.01); *H01L 2924/14335* (2013.01)

(58) Field of Classification Search
CPC .............. H01L 25/043; H01L 25/0657; H01L 25/0652; H01L 25/0756
See application file for complete search history.

(56) References Cited

U.S. PATENT DOCUMENTS

| 5,783,870 A * | 7/1998 | Mostafazadeh et al. ...... 257/791 |
| 2008/0080261 A1 * | 4/2008 | Shaeffer et al. .......... 365/189.05 |

FOREIGN PATENT DOCUMENTS

KR        100843243 B1     6/2008

* cited by examiner

*Primary Examiner* — Phat X Cao
(74) *Attorney, Agent, or Firm* — William Park & Associates Ltd.

(57) ABSTRACT

A semiconductor apparatus includes a plurality of stack dies which are formed with a predetermined number of channels. The semiconductor apparatus also includes a base die configured to initialize a channel not electrically coupled with the stack dies.

13 Claims, 3 Drawing Sheets

US 9,305,909 B2

3D SEMICONDUCTOR APPARATUS FOR INITIALIZING CHANNELS

CROSS-REFERENCES TO RELATED APPLICATION

The present application claims priority under 35 U.S.C. §119(a) to Korean application number 10-2013-0166562, filed on Dec. 30, 2013, in the Korean Intellectual Property Office, which is incorporated herein by reference in its entirety.

BACKGROUND

1. Technical Field

Various embodiments relate to a semiconductor apparatus, and more particularly, to a 3D (three-dimensional) semiconductor apparatus in which a plurality of dies are stacked.

2. Related Art

In order to improve the degree of integration of a semiconductor apparatus, a 3D (three-dimensional) semiconductor apparatus, in which a plurality of chips are stacked and packaged in a single package to increase the degree of integration, has been developed. Recently, a TSV (through-silicon via) type semiconductor apparatus has been disclosed in the art, in which through-silicon vias are formed to pass through a plurality of stacked chips such that all the chips are electrically connected with one another.

The 3D semiconductor apparatus includes a plurality of stack dies and a base die which relays communication between an external device and the stack dies.

It is advantageous in terms of cost to manufacture chips having the same structure in a semiconductor manufacturing procedure.

SUMMARY

In an embodiment, a semiconductor apparatus includes a plurality of stack dies formed with a predetermined number of channels. The semiconductor apparatus also includes a base die configured to initialize a channel not electrically connected with the stack dies.

In an embodiment, a semiconductor apparatus includes a base die and at least one stack die stacked upon each other and formed with a plurality of output channels. In addition, the at least one stack die initializes an output channel which is electrically coupled with the at least one stack die, and the base die initializes an output channel not electrically coupled with the at least one stack die.

In an embodiment, a semiconductor apparatus includes a base die and first to $m^{th}$ stack dies stacked upon each other and formed with first to $n^{th}$ input channels and first to $n^{th}$ output channels. The semiconductor apparatus also includes the first to $m^{th}$ stack dies being electrically coupled with at least one of the first to $m^{th}$ input channels and at least one of the first to $m^{th}$ output channels. Moreover n is an integer greater than or equal to 3 and m is an integer less than n Further, the first to $m^{th}$ stack dies initialize the first to $m^{th}$ output channels, and the base die initializes $m+1^{th}$ to $n^{th}$ output channels.

DETAILED DESCRIPTION

Hereinafter, a 3D semiconductor apparatus for initializing channels according to the disclosure will be described below with reference to the accompanying figures through various embodiments. A 3D semiconductor apparatus which can initialize all channels regardless of the number of stack dies stacked upon one another is described herein.

Figure 1:
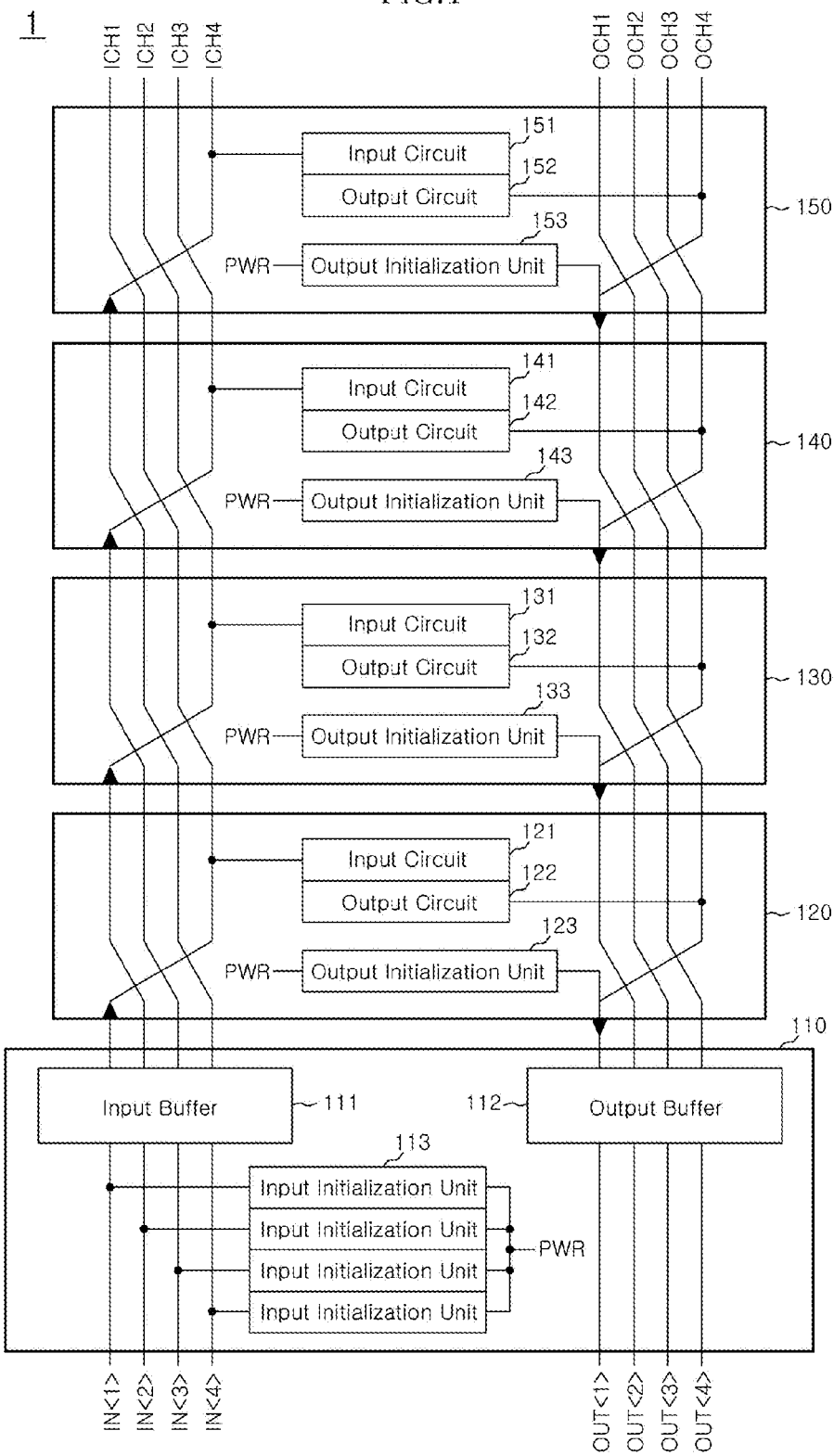
FIG. 1 is a view showing the configuration of a semiconductor apparatus in accordance with an embodiment of the disclosure.

In FIG. 1, a 3D semiconductor apparatus 1 in accordance with an embodiment may include a base die 110 and first to fourth stack dies 120 to 150. The base die 110 may control the respective operations of the first to fourth stack dies 120 to 150. The base die 110 may also relay transmission and reception of signals. For example, a relay transmission and reception of signals may include data communication between an external device (not shown) and the first to fourth stack dies 120 to 150. The first to fourth stack dies 120 to 150 may have the same structure. The first to fourth stack dies 120 to 150 may perform their intrinsic functions by being controlled by the base die 110. While it is illustrated in an embodiment that the semiconductor apparatus 1 includes one base die 110 and four stack dies 120 to 150, the disclosure is not limited to such. Further, the numbers of a base die and stacked dies may be changed according to a semiconductor apparatus product.

The base die 110 and the first to fourth stack dies 120 to 150 may be stacked upon one another. In addition, the base die 110 and the first to fourth stack dies 120 to 150 may be packaged into a single package to constitute a single semiconductor apparatus. The 3D semiconductor apparatus 1 may be realized in the form of a system-in-package, a flip chip package, a multi-chip package, a package-on-package, and so forth.

The base die 110 may be a memory controller or a host processor. The base die 110 may include a central processing unit (CPU), a graphic processing unit (GPU), a digital signal processor (DSP), at least one processor core, a single core processor, a dual core processor, a multiple core processor, a microprocessor, a host processor, a controller, a plurality of processors or controllers, a chip, a microchip, a logic circuit, an integrated circuit (IC), or an application-specific IC.

The stack dies 120 to 150 may be memories. Each of the stack dies 120 to 150 may include a volatile random access memory device such as a DRAM (dynamic random access memory). Further, the stack dies 120 to 150 may each include a nonvolatile random access memory such as a PCRAM (phase change random access memory), an ReRAM (resistive random access memory), an FeRAM (ferroelectric random access memory), an MRAM (magnetic random access memory) and an STTRAM (spin torque transfer random access memory), or a NAND flash memory.

The base die 110 and the first to fourth stack dies 120 to 150 may be formed with a plurality of channels. Referring to FIG. 1, the first to fourth channels ICH1 to ICH4 and OCH1 to OCH4 are formed in the base die 110 and the first to fourth stack dies 120 to 150. The first to fourth channels ICH1 to ICH4 and OCH1 to OCH4 may be signal paths which electrically couple the base die 110 and the first to fourth stack dies 120 to 150. The first to fourth channels ICH1 to ICH4 and OCH1 to OCH4 may use wires or through silicon vias. In particular, in an embodiment, the first to fourth channels ICH1 to ICH4 and OCH1 to OCH4 may be through silicon vias. The base die 110 is electrically coupled in common with the first to fourth channels ICH1 to ICH4 and OCH1 to OCH4. In addition, the first to fourth channels ICH1 to ICH4 and OCH1 to OCH4 may be electrically coupled with the external device which communicates with the semiconductor apparatus 1.

The first to fourth stack dies 120 to 150 may operate and perform functions, independently of one another. The base die 110 may individually control the first to fourth stack dies 120 to 150 through the first to fourth channels ICH1 to ICH4 and OCH1 to OCH4. The first to fourth stack dies 120 to 150 may be electrically coupled with the first to fourth channels ICH1 to ICH4 and OCH1 to OCH4. The first stack die 120 may be electrically coupled with the first channels ICH1 and OCH1. The second stack die 130 may be electrically coupled with the second channels ICH2 and OCH2. The third stack die 140 may be electrically coupled with the third channels ICH3 and OCH3. Further, the fourth stack die 150 may be electrically coupled with the fourth channels ICH4 and OCH4. The first to fourth channels ICH1 to ICH4 and OCH1 to OCH4 may include first to fourth input channels ICH1 to ICH4 and first to fourth output channels OCH1 to OCH4. The first to fourth input channels ICH1 to ICH4 provide signal paths through which input signals IN<1:4> received from the external device are transmitted through the base die 110 to the first to fourth stack dies 120 to 150. In addition, the first to fourth output channels OCH1 to OCH4 provide signal paths. The signal paths are which the signals are transmitted as output signals OUT<1:4> that are outputted from the first to fourth stack dies 120 to 150 through the base die 110 to the external device.

The first to fourth stack dies 120 to 150 may respectively operate as individual ranks or groups. As the first to fourth stack dies 120 to 150 are respectively electrically coupled with the first to fourth channels ICH1 to ICH4 and OCH1 to OCH4, they may receive different signals from the base die 110. The first to fourth stack dies 120 to 150 may also perform different operations. More specifically, when it is necessary for the second stack die 130 to operate, the base die 110 may transmit a signal necessary for the second stack die 130 to operate through the second input channel ICH2 to the second stack die 130. Further, the base die 110 may receive the signal outputted from the second stack die 130 through the second output channel OCH2.

The first to fourth input channels ICH1 to ICH4 and the first to fourth output channels OCH1 to OCH4 may be changed in their positions through redistribution layers formed of a metal. In particular, in the first stack die 120, the first input channel ICH1 may be changed to a most right position through a redistribution layer. The redistribution layer may be formed on the bottom of the first stack die 120. In addition, the redistribution layer may be sequentially changed leftward in its position through redistribution layers which are respectively formed on the bottom of the second to fourth stack dies 130 to 150. Through such structures of the redistribution layers and the channels, all the first to fourth stack dies 120 to 150 may have the same structure.

The base die 110 may include an input buffer 111, an output buffer 112, and input initialization units 113. The input buffer 111 may be electrically coupled with the first to fourth input channels ICH1 to ICH4. The input buffer 111 may also buffer the input signals IN<1:4> received from the external device. In addition, the input buffer 111 may transmit a buffered signal to a channel electrically coupled with a stack die which needs to currently operate. The output buffer 112 may be electrically coupled with the first to fourth output channels OCH1 to OCH4. The output buffer 112 may also receive and buffer the signal outputted from a stack die which currently operates. Further, the output buffer 112 may output the output signals OUT<1:4> to the external device.

The input initialization units 113 may be electrically coupled with the first to fourth input channels ICH1 to ICH4. The input initialization units 113 may also initialize the first to fourth input channels ICH1 to ICH4 in response to a power-up signal PWR. The power-up signal PWR is a signal which may be generated to initialize a circuit in the semiconductor apparatus 1 when power is applied to the semiconductor apparatus 1 and the voltage level of the power is stabilized. The power-up signal PWR may be inputted to the semiconductor apparatus 1 through the external device, and may be generated internally of the semiconductor apparatus 1. The input initialization units 113 may drive the first to fourth input channels ICH1 to ICH4 to a predetermined level. More specifically, a predetermined level may be for example, a logic low level, in response to the power-up signal PWR. As a result, the initialization units 113 may thereby initialize the first to fourth input channels ICH1 to ICH4.

The first to fourth stack dies 120 to 150 may include input circuits 121, 131, 141 and 151, output circuits 122, 132, 142 and 152, and output initialization units 123, 133, 143 and 153. The input circuits 121, 131, 141 and 151 may be respectively electrically coupled with the first to fourth input channels ICH1 to ICH4. The input circuits 121, 131, 141 and 151 may also receive the input signals IN<1:4> transmitted through the first to fourth input channels ICH1 to ICH4. The input circuits 121, 131, 141 and 151 may be certain internal circuits for performing the functions of the first to fourth stack dies 120 to 150. The output circuits 122, 132, 142 and 152 may be respectively electrically coupled with the first to fourth output channels OCH1 to OCH4. In addition, the output circuits 122, 132, 141 and 152 may also output signals through the first to fourth output channels OCH1 to OCH4. The output circuits 122, 132, 142 and 152 may be certain internal circuits which may generate the output signals OUT<1:4> to be outputted from the first to fourth stack dies 120 to 150 to the base die 110 or the external device.

The output initialization units 123, 133, 143 and 153 may be respectively disposed in the first to fourth stack dies 120 to 150. The output initialization units 123, 133, 143 and 153 may also be electrically coupled with the first to fourth output channels OCH1 to OCH4. The output initialization units 123, 133, 143 and 153 may initialize the first to fourth output channels OCH1 to OCH4 in response to the power-up signal PWR. The output initialization units 123, 133, 143 and 153 may drive the first to fourth output channels OCH1 to OCH4 to a predetermined level in response to the power-up signal PWR. The predetermined level may be for example, a logic low level. The output initialization units 123, 133, 143 and 153 may thereby initialize the first to fourth output channels OCH1 to OCH4.

Figure 2:
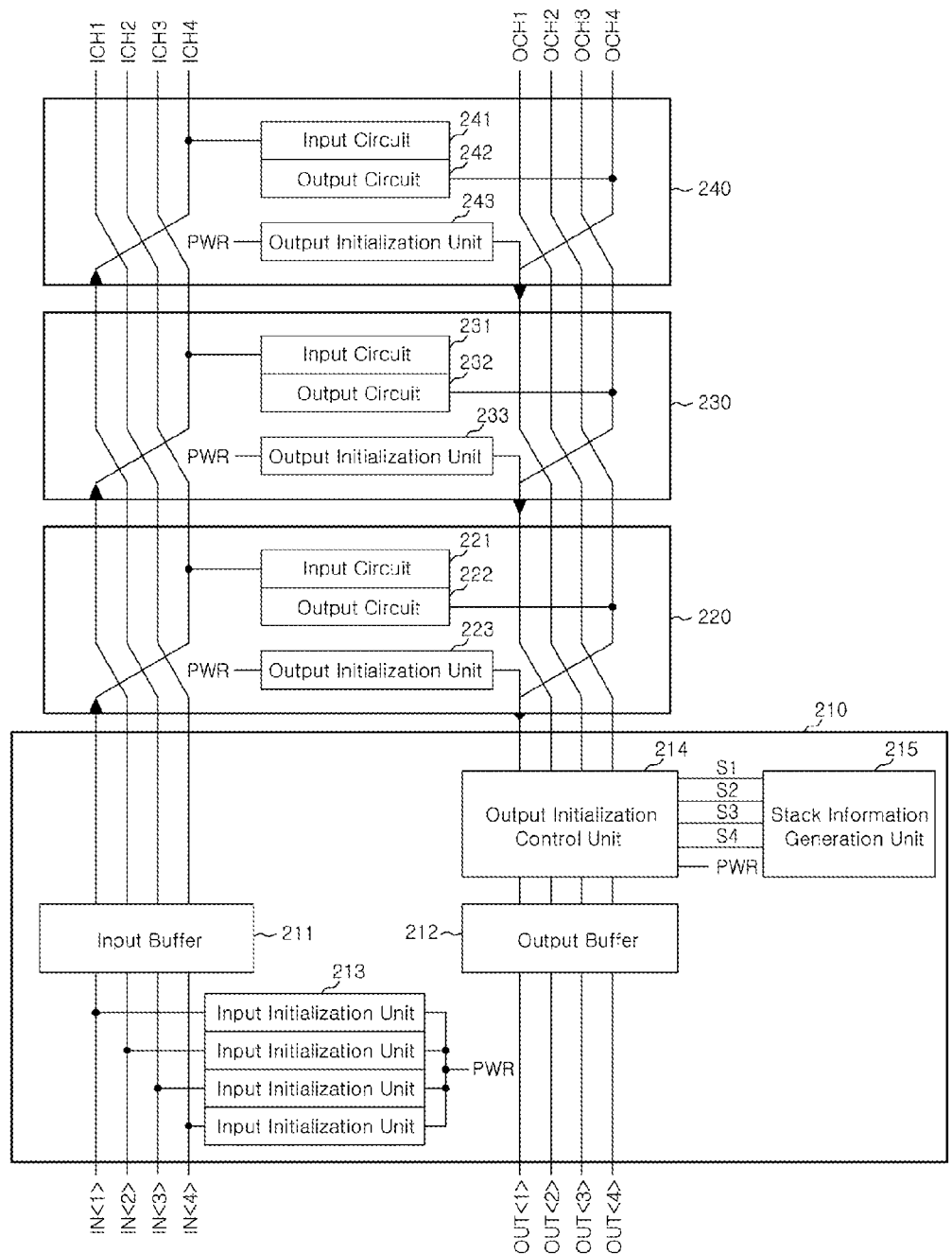
FIG. 2 is a view showing the configuration of a semiconductor apparatus in accordance with an embodiment of the disclosure.

Referring to FIG. 2, a view showing the configuration of a 3D semiconductor apparatus 2 in accordance with an embodiment is illustrated. In FIG. 2, the 3D semiconductor apparatus 2 may include a base die 210 and a plurality of stack dies 220 to 240. The base die 210 and the plurality of stack dies 220 to 240 may be formed with a predetermined number of channels. In the 3D semiconductor apparatus 2, stack dies the number of which is smaller than the predetermined number of the channels may be stacked. In FIG. 2, the base die 210 and the first to third stack dies 220 to 240 are stacked to constitute the semiconductor apparatus 2. In addition, first to fourth channels ICH1 to ICH4 and OCH1 to OCH4 may be formed in the base die 210 and the first to third stack dies 220 to 240.

The base die 210 and the first to third stack dies 220 to 240 which are formed with the predetermined number of channels may be dies which are manufactured to be applied to a semiconductor apparatus product in which four stack dies and a base die are to be stacked. FIG. 2 illustrates where only three stack dies which are capable of being applied to a semiconductor apparatus product in which four stack dies are to be stacked, are stacked. The number of stack dies also may be one or two.

The first to fourth channels ICH1 to ICH4 and OCH1 to OCH4 may include first to fourth input channels ICH1 to ICH4 and first to fourth output channels OCH1 to OCH4. Since the number of stack dies constituting the semiconductor apparatus 2 is three, the first to third stack dies 220 to 240 may be electrically coupled with the first to third input channels ICH1 to ICH3. Moreover, the first to third stack dies 220 to 240 may also be electrically coupled to the first to third output channels OCH1 to OCH3. The fourth input channel ICH4 and the fourth output channel OCH4 may have no electrical connections over the base die 210.

The base die 210 may initialize the first to fourth input channels ICH1 to ICH4. The first to third stack dies 220 to 240 may initialize the first to third output channels OCH1 to OCH3 that the first to third stack dies 220 to 240 are electrically coupled with. The base die 210 may initialize the channels ICH4 and OCH4 which are not electrically coupled with a stack die. Therefore, the base die 210 may initialize the fourth output channel OCH4 which does not have any electrical connection over the base die 210.

Referring once more to FIG. 2, the base die 210 may include an input buffer 211, an output buffer 212, and input initialization units 213. The input buffer 211 may be electrically coupled with the first to fourth input channels ICH1 to ICH4. The input buffer 211 may also transmit input signals IN<1:4> received through the first to fourth input channels ICH1 to ICH4 from an external device, to the first to third stack dies 220 to 240. Because the semiconductor apparatus 2 does not include a stack die electrically coupled with the fourth channels ICH4 and OCH4, a signal is not transmitted to the fourth input channel ICH4. The input initialization units 213 may initialize the first to fourth input channels ICH1 to ICH4 in response to a power-up signal PWR. The input initialization units 213 may drive the first to fourth input channels ICH1 to ICH4 to a predetermined level in response to the power-up signal. The predetermine level may be, for example, a logic low level. Accordingly, the input initialization units 213 may thereby initialize the first to fourth input channels ICH1 to ICH4.

The first to third stack dies 220 to 240 may include input circuits 221, 231 and 241, output circuits 222, 232 and 242, and output initialization units 223, 233 and 243. The input circuits 221, 231 and 241 may be internal circuits which operate by receiving the input signals IN<1:3>. The input signals IN<1:3> may be transmitted through the first to third input channels ICH1 to ICH3. The output circuits 222, 232 and 242 may be internal circuits which generate output signals OUT<1:3> to be outputted to the base die 210. The output signals OUT<1:3> may also be outputted to the external device through the first to third output channels OCH1 to OCH3. The output initialization units 223, 233 and 243 may initialize the first to third output channels OCH1 to OCH3 in response to the power-up signal PWR.

To initialize the fourth output channel OCH4 not electrically coupled with a stack die, the base die 210 may include an output initialization control unit 214 and a stack information generation unit 215. The output initialization control unit 214 may initialize a channel not electrically coupled with a stack die. In FIG. 2, the output initialization control unit 214 may initialize the fourth output channel OCH4. The output initialization control unit 214 may initialize a channel which is not electrically coupled with a stack die, in response to the power-up signal PWR and stack information. The stack information may be information on the number of stack dies which constitute the semiconductor apparatus 2.

The stack information generation unit 215 may generate the stack information. The stack information may include a plurality of slice signals S1 to S4. In FIG. 2, the stack information generation unit 215 may generate first to fourth slice signals S1 to S4. Moreover, to inform information that the first to third stack dies 220 to 240 are stacked and electrically coupled with the first to third channels ICH1 to ICH3 and OCH1 to OCH3, the stack information generation unit 215 may disable the first to third slice signals S1 to S3. Further, the stack information generation unit 215 may enable the fourth slice signal S4. If the semiconductor apparatus 2 includes two stack dies, the stack information generation unit 215 may disable the first and second slice signals S1 and S2. In addition, the stack information generation unit 215 may enable the third and fourth slice signals S3 and S4. The stack information generation unit 215 may be realized as a fuse circuit. The stack information generation unit 215 may also be realized as a test mode signal generation circuit which may output different levels according to the number of stack dies stacked or the number of stack dies electrically coupled with channels.

As the output initialization control unit 214 initializes the fourth output channel OCH4 not electrically coupled with a stack die, it is possible to prevent the fourth output channel OCH4 from being floated. In addition, current consumption likely to be caused in the internal circuits disposed in the base die 210, by the level of the fourth output channel OCH4 which is not initialized, may be reduced.

Figure 3:
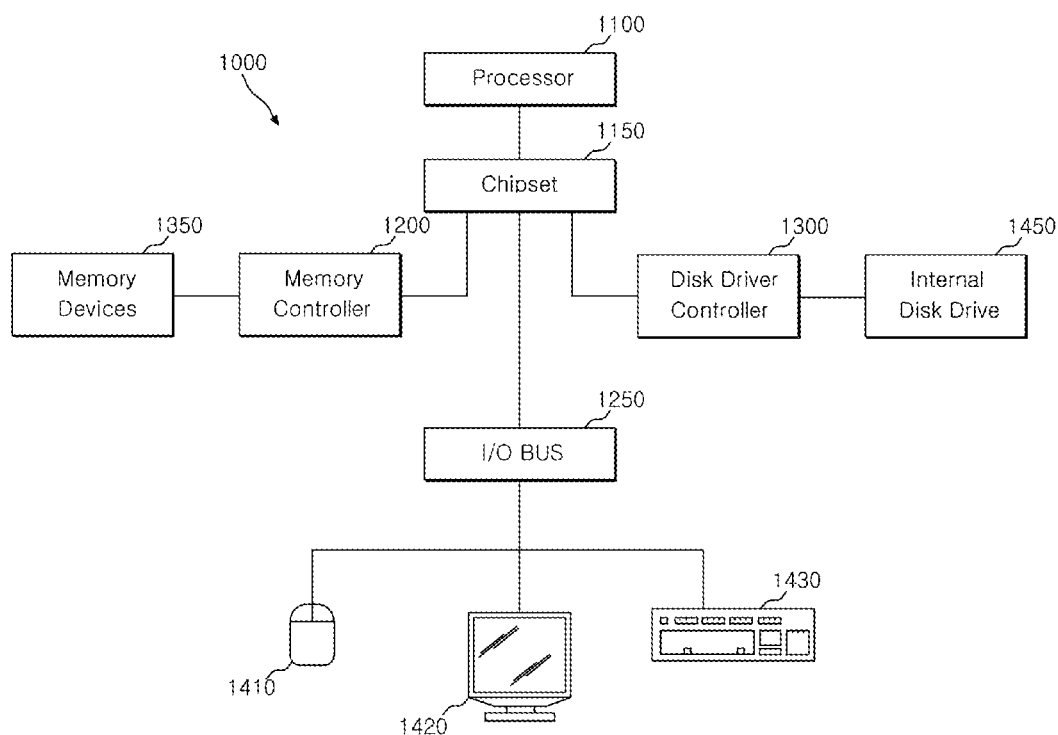
FIG. 3 illustrates a block diagram of a system employing a memory controller circuit in accordance with an embodiment of the invention.

Referring to FIG. 3, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components of the system 1000 may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may include the semiconductor apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drive 1450 may communicate with each other or with the chipset 1150 using virtually any type of communication protocol.

While certain embodiments have been described above, it will be understood to those skilled in the art that the embodiments described are by way of example. Accordingly, the 3D semiconductor apparatus for initializing channels described herein should not be limited based on the described embodiments. Rather, the 3D semiconductor apparatus for initializing channels described herein should only be limited in light of the claims that follow when taken in conjunction with the above description and accompanying drawings.

What is claimed is:

1. A semiconductor apparatus comprising:
a plurality of stack dies formed with a predetermined number of channels, and
a base die configured to initialize a channel not electrically coupled with the stack dies,
wherein the base die comprises an output initialization control unit configured to initialize the channel not electrically coupled with the stack dies based on a power-up signal and stack information.

2. The semiconductor apparatus according to claim 1, wherein the base die initializes input channels which are respectively electrically coupled with the plurality of stack dies.

3. The semiconductor apparatus according to claim 1, wherein the plurality of stack dies initialize output channels which are respectively electrically coupled with them.

4. A semiconductor apparatus comprising:
a base die and at least one stack die stacked upon each other and formed with a plurality of output channels,
wherein the at least one stack die initializes an output channel which is electrically coupled with the at least one stack die, and the base die initializes an output channel not electrically coupled with the at least one stack die,
wherein the base die comprises an output initialization control unit configured to initialize the output channel not electrically coupled with the at least one stack die based on a power-up signal and stack information.

5. The semiconductor apparatus according to claim 4, wherein the at least one stack die comprises:
an output initialization unit which initializes an output channel electrically coupled with the at least one stack die in response to the power-up signal.

6. A semiconductor apparatus comprising:
a base die and first to $m^{th}$ stack dies stacked upon each other and formed with first to $n^{th}$ input channels and first to $n^{th}$ output channels, the first to $m^{th}$ stack dies being electrically coupled with at least one of the first to $m^{th}$ input channels and at least one of the first to $m^{th}$ output channels,
wherein n is an integer greater than or equal to 3 and m is an integer less than n, and
wherein the first to $m^{th}$ stack dies initialize the first to $m^{th}$ output channels, and the base die initializes $m+1^{th}$ to $n^{th}$ output channels,
wherein the base die comprises an output initialization control unit electrically coupled with the first to $n^{th}$ output channels and configured to initialize the $m+1^{th}$ to $n^{th}$ output channels based on a power-up signal and stack information.

7. The semiconductor apparatus according to claim 6, wherein the base die further comprises:
a stack information generation unit configured to provide the stack information according to the number of stack dies stacked.

8. The semiconductor apparatus according to claim 7, wherein the stack information includes first to $n^{th}$ slice signals, and provides $m+1^{th}$ to $n^{th}$ slice signals to the output initialization control unit.

9. The semiconductor apparatus according to claim 6, wherein the first to $m^{th}$ stack dies comprise:
output initialization units which respectively initialize the first to $n^{th}$ output channels in response to the power-up signal.

10. The semiconductor apparatus according to claim 6, wherein the base die comprises:
input initialization units electrically coupled with the first to $n^{th}$ input channels and configured to initialize the first to $n^{th}$ input channels in response to the power-up signal.

11. The semiconductor apparatus according to claim 6, wherein the first to $m^{th}$ stack dies are configured to initialize the at least one of the first to $n^{th}$ output channels electrically coupled to the first to $m^{th}$ stack dies.

12. The semiconductor apparatus according to claim 11, wherein the base die is configured to initialize at least one of the first to $n^{th}$ input channels and at least one of the first to $n^{th}$ output channels not electrically coupled with the first to $m^{th}$ stack dies.

13. The semiconductor apparatus according to claim 6, wherein at least one of the first to the $n^{th}$ input channels not electrically coupled to the first to the $m^{th}$ stack dies is configured not to receive a signal.

* * * * *